(12) United States Patent
Sano

(10) Patent No.: US 12,362,249 B2
(45) Date of Patent: Jul. 15, 2025

(54) FLEXIBLE ELECTRONIC DEVICE

(71) Applicant: Japan Display Inc., Tokyo (JP)

(72) Inventor: Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 309 days.

(21) Appl. No.: 18/305,428

(22) Filed: Apr. 24, 2023

(65) Prior Publication Data
US 2023/0343660 A1 Oct. 26, 2023

(30) Foreign Application Priority Data
Apr. 26, 2022 (JP) .................................. 2022-072212

(51) Int. Cl.
| | | |
|---|---|---|
| *G06F 1/16* | (2006.01) |
| *H01L 23/14* | (2006.01) |
| *H01L 25/16* | (2023.01) |
| *H05K 5/00* | (2025.01) |
| *H05K 7/00* | (2006.01) |
| *G09G 3/00* | (2006.01) |

(52) U.S. Cl.
CPC .......... *H01L 23/145* (2013.01); *H01L 25/167* (2013.01); *G09G 3/035* (2020.08); *G09G 2300/0426* (2013.01)

(58) Field of Classification Search
CPC ..... H01L 23/145; H01L 23/147; H01L 23/15; H01L 23/142; H01L 23/14; H01L 23/13; H01L 25/167; H01L 25/16; G09G 3/035; G09G 3/03; G06F 1/1652
See application file for complete search history.

(56) References Cited

U.S. PATENT DOCUMENTS

| | | | | |
|---|---|---|---|---|
| 2014/0131683 A1* | 5/2014 | Kim | ..................... | H10K 59/873 438/22 |
| 2014/0183476 A1* | 7/2014 | Kwon | ..................... | H10D 64/62 257/43 |
| 2016/0149156 A1* | 5/2016 | Kim | ..................... | H10K 59/121 438/46 |
| 2016/0351636 A1* | 12/2016 | Lee | ..................... | H10K 50/824 |
| 2017/0279057 A1* | 9/2017 | Park | ..................... | H10K 50/80 |
| 2019/0131365 A1* | 5/2019 | Jung | ..................... | H10K 59/1213 |
| 2021/0119175 A1* | 4/2021 | Harikrishna Mohan | | ..................... H10K 59/873 |

(Continued)

FOREIGN PATENT DOCUMENTS

JP 2021-106199 A 7/2021

*Primary Examiner* — Anthony M Haughton
(74) *Attorney, Agent, or Firm* — Michael Best & Friedrich LLP

(57) ABSTRACT

Purpose is to realize a flexible electronic device of high reliability. The present invention takes a following structure to realize the purpose. An electronic device including: a plurality of element areas, famed from a first organic insulating film, and formed in island shape arranged in a first direction with a first space and arranged in a second direction with a second space, in which an element, a first wiring extending in the first direction and a second wiring extending in the second direction are formed in each of the plurality of element areas, the first wirings famed in the plurality of the element areas are connected with each other by a first wire bonding in the first direction, and the second wirings famed in the plurality of the element areas are connected with each other by a second wire bonding in the second direction.

13 Claims, 13 Drawing Sheets

(56) References Cited

U.S. PATENT DOCUMENTS

| | | | |
|---|---|---|---|
| 2021/0336203 A1* | 10/2021 | Sun .................... | H10K 59/124 |
| 2022/0270988 A1* | 8/2022 | Nishimura .......... | H01F 27/2804 |
| 2022/0320259 A1 | 10/2022 | Sano | |
| 2022/0384749 A1* | 12/2022 | Hishinuma .......... | H10K 50/844 |

* cited by examiner

B-B

C-C

FLEXIBLE ELECTRONIC DEVICE

CLAIM OF PRIORITY

The present application claims priority from Japanese Patent Application JP 2022-072212 filed on Apr. 26, 2022, the content of which is hereby incorporated by reference into this application.

BACKGROUND OF THE INVENTION

(1) Field of the Invention

The present invention relates to an electronic device having flexibility and stretchability.

(2) Description of the Related Art

A demand for a flexible and stretchable electronic device is expanding. Usages of such flexible electronic devices are, for example, to attach to a curved housing including an electronic device, to attach to the curved display media, to attach to human body as a sensor and so forth. AS to elements, there are, for example, various sensors as a touch sensor, a temperature sensor, a pressure sensor, an acceleration sensor, and so forth, or lighting elements which constitute various display devices, light valves and so forth.

In such electronic devices, scanning lines and signal lines are used to control each of the elements. Flexible devices must adapt bending or stretching. Patent document 1 discloses a device having a structure that can adapt the stretching and bending by making the scanning lines and signal lines form as serpentine (herein after it may be called as meander wirings).

Patent document 1: Japanese patent application laid open No. 2021-106199

SUMMARY OF THE INVENTION

A flexible electronic device can have some adaptability to stretching and bending by making the scanning liens and signal lens in meander structure. However, uniform stress is not necessarily applied to entire wirings when the device is stretched or bent even scanning lines and signal lines are made in meander wiring structure.

That is to say, a disconnection occurs at a portion in which maximum stress is built when a device is stretched or bent. Conversely, an adaptability of the flexible electronic devices to bending or stretching can be improved by modifying the structure at a portion in which a maximum stress is built.

The purpose of the present invention is to realize a flexible electronic device having high adaptability to stretch or bending by counter measuring the structure at a portion in which maximum stress is built, and thus, to realize a reliable flexible electronic device.

The present invention solves the above explained problems; the representative structures are as follows.

(1) An electronic device including: a plurality of element areas, formed from a first organic insulating film, and formed in island shape arranged in a first direction with a first space and arranged in a second direction with a second space, in which an element, a first wiring extending in the first direction and a second wiring extending in the second direction are formed in each of the plurality of element areas, the first wirings famed in the plurality of the element areas are connected with each other by a first wire bonding in the first direction, and the second wirings formed in the plurality of the element areas are connected with each other by a second wire bonding in the second direction.

(2) The electronic device according to (1), in which the plurality of the element areas are formed on a second organic insulating film and covered by a third organic insulating film.

(3) The electronic device according to (2), in which each of young's modulus of the second organic insulating film and the third organic insulating film is smaller than young's modulus of the first organic insulating film.

DETAILED DESCRIPTION OF THE PREFERRED EMBODIMENTS

The present invention is explained in detail by the following embodiments.

Embodiment 1

Figure 1:
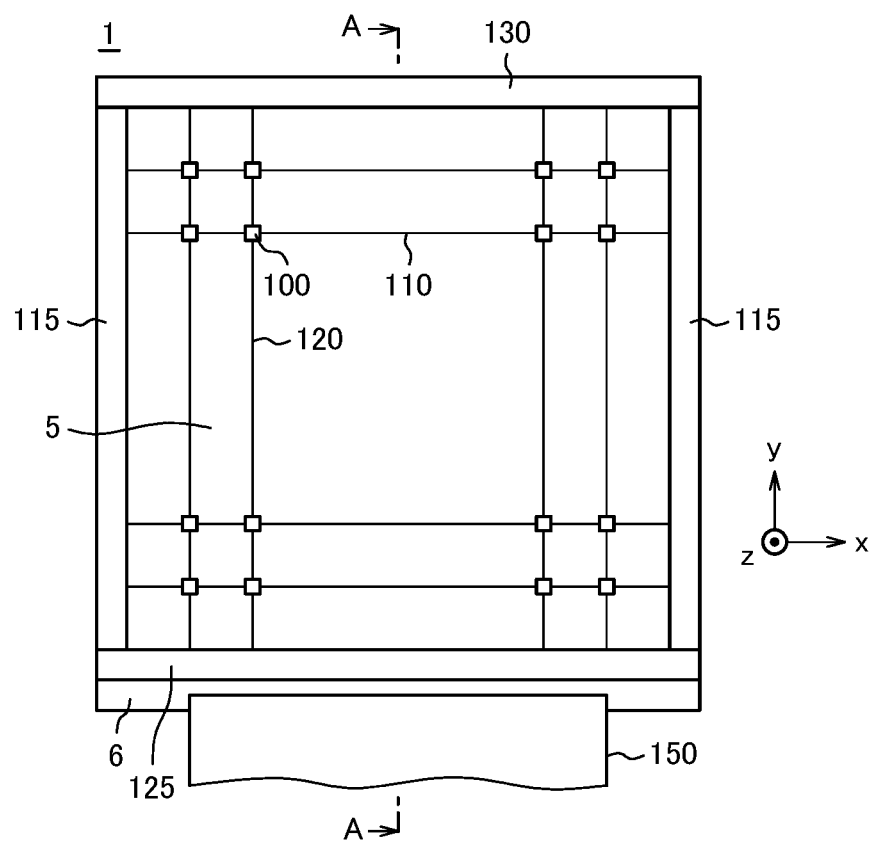
FIG. 1 is a plan view of a flexible electronic device according to a comparative example.

FIG. 1 is a plan view of a flexible electronic device 1 in embodiment 1. Even the flexible electronic device of FIG. 1 is flat as a total, it can be bent in z direction or can be stretched in x-y plane. Even elongation at break of the flexible electronic device, namely, an elongation in which a flexible electronic device is broken, is different according to material which constitutes the flexible electronic device 1; a ratio of elongation at break can be achievable to 30% when the main material is organic substance, which has high extensibility. In some cases, the elongation at break may become as high as 60%. On the other hand, inorganic material is used in many parts, the elongation at break is approximately 10% to 15%.

In FIG. 1, an active area 5 occupies a large portion in the flexible electronic device 1. In the active area 5, electronic elements 100 are arranged in matrix. As the electronic device 100, for example, a sensor, a semiconductor element, an actuator and so forth can be arranged. As sensors, for example, a light sensor of visible light or infra-red light, a temperature sensor, a pressure sensor, a touch sensor and so forth can be arranged. As semiconductor devices, for example, a light emitting element, a light receiving element, a diode, a transistor and so forth can be arranged. As actuators, for example, a piezo element and so forth can be arranged.

Each electronic element is connected to the scanning line 110 and the signal line 120. The scanning lines 110 extend in lateral direction (the x direction, corresponds to the first direction) and are arranged in longitudinal direction (the y direction, corresponding to the second direction). The signal lines 120 extend in longitudinal direction (the y direction) and are arranged in lateral direction (the x direction). The structures of scanning lines 110 and the signal lines 120 are important to form a stretchable electronic device. That is to say, the scanning lines 110 and the signal lines 120 should have a structure in which a disconnection does not easily occur when the flexible electronic device is stretched.

In FIG. 1, driving circuits 115, 125, and a terminal area 6 are disposed outside of the display area 5. Scanning line driving circuits 115 are disposed at both sides in the x direction of the display area 5; a power circuit 130 which supplies power to the electronic elements 100 is disposed at a top position in the y direction of the display area 5; a signal line driving circuit 125 is disposed at a bottom side in the y direction of the display area 5. The terminal area 6 is disposed at further bottom position than the signal driving circuit 125. A flexible wiring substrate 150 which supplies power and signals to the flexible electronic device 1 and send signals to outside of the flexible electronic device 1 is connected to the terminal area 6.

Figure 2:
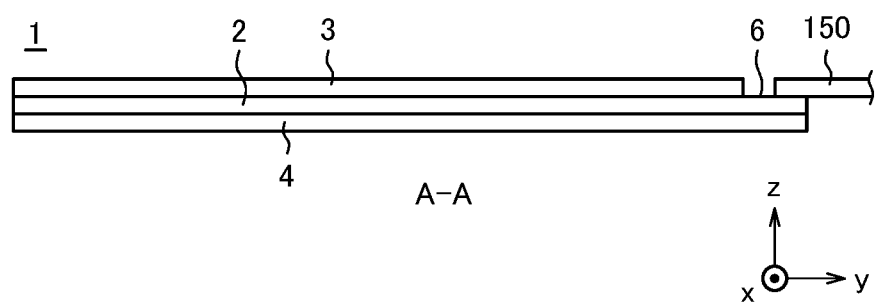
FIG. 2 is a cross sectional view of FIG. 1 along the line A-A.

FIG. 2 is a cross sectional view of FIG. 1 along the line A-A. FIG. 2 is a schematic cross-sectional view. In FIG. 2, electronic elements 100, scanning lines 110, signal lines 120 and so forth described with reference to FIG. 1 are disposed in the element layer 2. The element layer 2 is sandwiched by a top protecting layer 3 at the top and a bottom protecting layer 4 at the bottom. Both the top protecting layer 3 and the bottom protecting layer 4 are famed from a material which is easy to be defamed elastically, that is to say, a material having small young's modulus.

In FIG. 2, the active area 5, driving circuits 115, 125 and so forth are covered by the top protecting layer 3 and the bottom protecting layer 4; a terminal portion of the element layer 2 is not covered by the top protecting layer 3, which constitutes a terminal area 6. The terminal area 6 is protected only from bottom side by the bottom protecting layer 4. The flexible wiring substrate 150 is connected to the terminal area 6.

Disconnections in the scanning lines 110 and the signal lines 120 become a problem when the electronic device 1 is stretched. In this invention, stresses in the scanning lines 110 and the signal lines 120 are mitigated by forming wire bonding between the electronic elements 100 as the scanning lines 110 and the signal lines 120. On the other hand, in a technology described in the patent document 1, the stress is mitigated by making the scanning lines 110 and the signal lines 120 extend in serpentine. This structure is called meander structure. In this specification, at the outset, the structure, in which the scanning lines 110 and the signal lines 120 are formed in meander structure, is explained, after that the structure of the present invention is explained.

Figure 3:
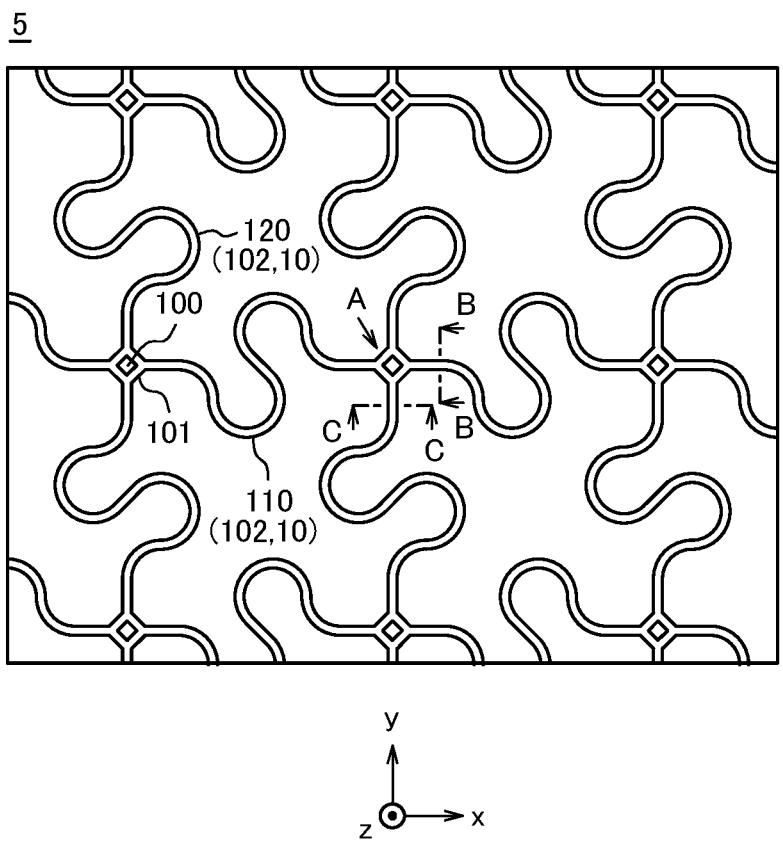
FIG. 3 is a plan view of wiring configuration in the active area according to the comparative example.

FIG. 3 is a plan view of the display area 5 which has a meander structure as a comparative example. The structures having meander structure, which is explained FIG. 3 and following figures, may include novel structure, thus, those structures in the comparative examples are not prior art. The structures except the scanning lines 110 and the signal lines 120, which are in meander structure, can be applied to the structure of embodiment 1. FIG. 3 is a main structure of the element layer 2 in FIG. 2. That is to say, the element layer 2 is not a simple plate but are formed in so called mesh structure. The meander structure 102, on which the scanning lines 110 and the signal lines 120 are formed, and the element areas 101 famed at cross regions of the scanning lines 110 and the signal lines 120 constitutes a so called mesh structure.

In FIG. 3, the meander structure 102 and the electronic element area 101, formed at the cross points of the meander structure 102, are formed from resin as polyimide. The scanning lines 110, the signal lines 120, the electronic elements 100, and so forth are formed on the resin, which constitutes the base structure 10. In FIG. 3, electronic elements 100, which are famed as diamond, are famed on the element areas 101. The reason of such structure is to mitigate a stress in components when the flexible electronic device 1 is stretched.

In FIG. 3, the element 100, which is famed as diamond, has a diameter in the x direction of e.g. 100 μm and a diameter in the y direction of e.g. 100 μm. A pitch in the x direction of the elements 100 is, for example, 250 μm. A pitch in the y direction of the elements 100 is, for example, 250 μm. A width of the base structure 10, on which scanning lines 110 and the signal lines 120 are famed, is, for example, 30 μm.

Figure 4:
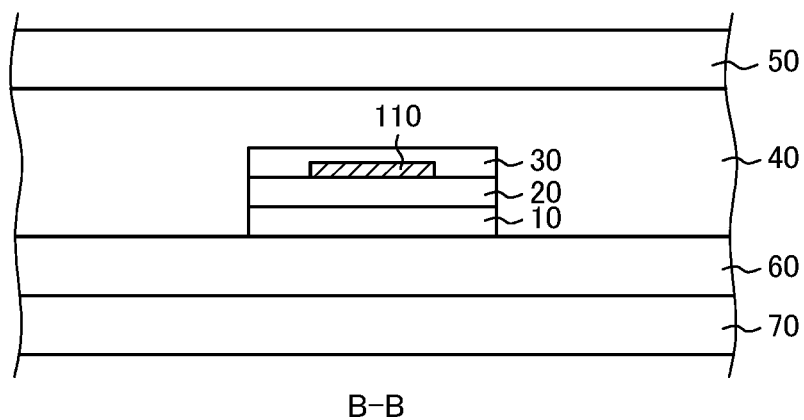
FIG. 4 is a cross sectional view of FIG. 3 along the line B-B.

FIG. 4 is a cross sectional view of FIG. 3 along the line B-B, which is a cross sectional view of the meander structure including the scanning line 110. In FIG. 4, a first organic insulating film 20 is famed on the base structure 10. The scanning line 110 is famed on the first organic insulating film 20. A second organic insulating film 30 is famed on the scanning line 110. The plan view of the meander structure 102 including the scanning lines 110 in FIG. 3 shows a plan view of the base structure 10.

The base structure 10, the first organic insulating film 20 and the second organic insulating film 30 are famed from polyimide. Since polyimide has good mechanical strength, heat resistance and so forth, it is suitable for a material for the base structure 10 of the scanning line 110 and the signal lines 120. That is to say, the polyimide undertakes a stress when the flexible electronic device is stretched, thus, stresses in the metal wires as the scanning lines 110 and so forth are mitigated.

The scanning line is famed from, for example, TAT (Ti—Al—Ti, Titanium-Aluminum-Titanium). In the three layers structure, the aluminum mainly undertakes conductivity, the titanium is used to protect the aluminum or to improve a contact with other wirings. Alternatively, MoW (Molybdenum-Tungsten alloy) and so forth are adopted for the scanning lines 110 according to usages of the flexible electronic devices.

Since the meander structure 102 including the scanning line 110 (herein after, may be called simply as scanning line 110) is mechanically unstable as depicted in FIG. 3, it is fixed by sandwiching from the top side and the bottom side by protecting layers (items 3 and 4 in FIG. 2). At the outset, the meander structure 102 including the scanning lines 110 is covered by a first buffer layer 40, which is famed from organic material; a first protecting layer 50, which is formed from organic material, is formed on the first buffer layer 40. A second buffer layer 60, which is formed from organic material, is disposed under the base structure 10; a second protecting layer 70, which is formed from organic material, is disposed under the second buffer layer 60.

As described above, the meander structure including the scanning lines 110 is unstable structure; however, it can be stable by sandwiching with the first buffer layer 40 and the second buffer layer 60 from top and bottom of the meander structure 10, and further sandwiching with the second buffer layer 50 and the second protection layer 70 from top and bottom. In the meantime, since the electronic device in the present invention is a flexible electronic device, it is necessary to stretch when a stretching force is applied from outside. Therefore, it is necessary that the buffer layers 40, 50 and the protecting layers 60, 70, which sandwich the meander structure formed from polyimide, are more stretchable compared with polyimide, in other words, to have smaller young's modulus compared with young's modulus of polyimide. Such materials are, for example, resins of acrylic, urethan, epoxy, silicone and so forth.

Figure 5:
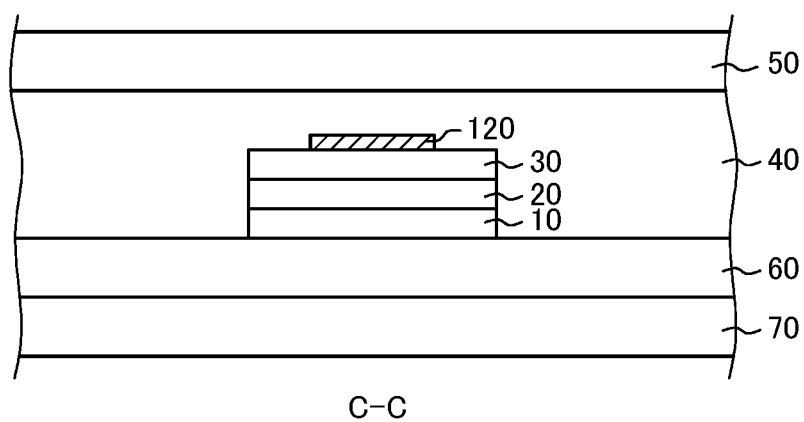
FIG. 5 is a cross sectional view of FIG. 3 along the line C-C.

FIG. 5 is a cross sectional view of FIG. 3 along the line C-C, which is a cross sectional view of the meander structure including the signal line 120. In the meander structure in FIG. 5, the first organic film 20 and the second organic film 30 are famed on the base structure 10 in succession and patterned. The signal line 120 is formed on the second organic film 30. In embodiment 1, the signal line 120 is foiled from the same material as the scanning line 110, namely, structure of TAT (Ti—Al—Ti), however, the material of the signal line 120 can be changed according to usage of the electronic device. Other structures are the same as explained with reference to FIG. 4 for the structure of the scanning line 110.

Figure 6:
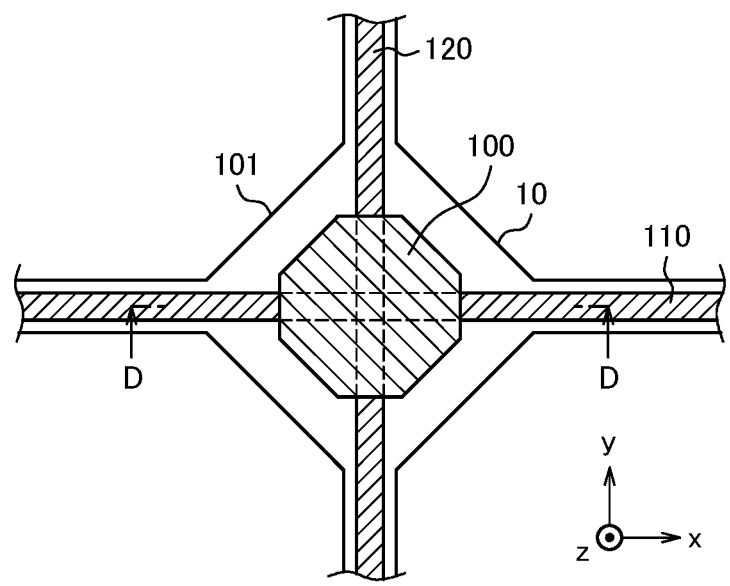
FIG. 6 is a plan view which shows an element and its vicinity according to the comparative example.

FIG. 6 is a plan view of the element area 101. The element area 101 is also defined by the base structure 10 famed from polyimide. The structure of the element area 101 in FIG. 6 is a diamond shape, however, since the apex of the diamond is connected either to the scanning line 110 or the signal line 120 of meander structures, outer shape of the element looks like octagon. Even the scanning lines 110 and the signal lines 120 are straight lines in FIG. 6, they are in meander structure as depicted in FIG. 3 outside of FIG. 6.

In FIG. 6, the element 100 is disposed on the element area 101. The outer structure of the element 100 is approximately octagon, in which apexes of the diamond are truncated. The scanning line 110 and the signal line 120 cross each other via insulating film under the element 100. FIG. 6 is, however, a schematic drawing; in an actual device, the scanning line 110 and the signal line 120 are connected with a transistor to drive the element 100 and so forth.

Figure 7:
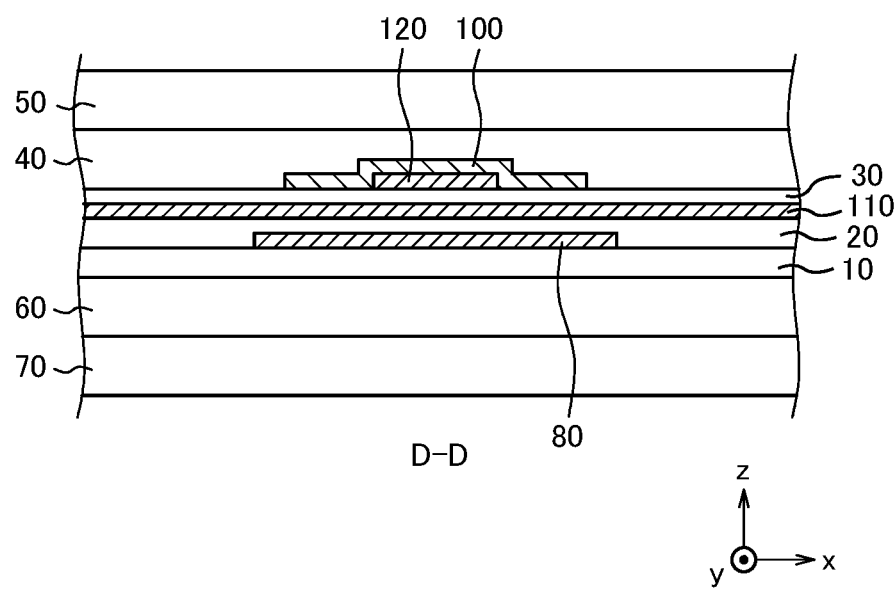
FIG. 7 is a cross sectional view of FIG. 6 along the line D-D.

FIG. 7 is a cross sectional view of FIG. 6 along the line D-D. In FIG. 7, inorganic insulating film 80 is famed on the base structure 10. The inorganic insulating film 80 stops impurities intruding from bottom side to prevent the element 100, which is famed above the inorganic insulating film 80, from being contaminated by the impurities. In FIG. 7, the inorganic insulating film 80 is famed on the base structure 10, however, it is only an example; the inorganic insulating film 80 can be formed at nearer layer to the element 100 according to necessity.

The inorganic insulating film 80 is famed from a silicon nitride film (a SiN film), a silicon oxide film (a SiO film), or laminated film of those films. Sometimes, aluminum oxide (an AlO film) is used as the inorganic insulating film 80. A rigidity of the inorganic insulating film 80 is high, however, it is formed only at the element area 101, thus, influence to the stretchability of the flexible electronic device is not high.

The first organic insulating film 20 is formed from, e.g., polyimide, covering the inorganic insulating film 80. The scanning line 110 extends in lateral direction (in the x direction) on the first organic insulating film 20. The second organic insulation film 30, formed from polyimide, is formed covering the scanning line 110 and the first organic insulating film 20. The signal line 120 extends in the y direction on the second organic insulating film 30.

The element 100 is disposed covering the signal line 120. Since FIG. 7 is a schematic view, connecting structures between the element 100 and the scanning line 110, and between the element 100 and the signal line 120, are omitted. Even it depends on what kind of element 100 is used, in general, a thin film transistor (TFT) is formed between the element 100 and the scanning line 110 or signal line 120; the TFT is controlled by the scanning line control circuit 115 and the signal line control circuit 125 control, and thus, the signal from the element 100 or a signal to the element 100 are controlled.

In FIG. 7, connection structures between the element 100 and the signal line 120 are different according to what kind of the element 100 is disposed. There is a possibility that a plurality of organic or inorganic insulating films are disposed between the element 100 and the signal line 120. However, in the structure of FIG. 7 and so forth, those insulating films are not famed on the signal lines 120 except at the area in which the element 100 is formed, so that the flexible electronic device can be easily stretched.

The plan view of FIG. 6 corresponds to a cross sectional structure from the base structure 10 to element 100 in FIG. 7. This structure, however, is not mechanically stable as depicted in a plan view of FIG. 3. Thus, as explained in FIG. 4, the first buffer layer 40, the first protecting layer 50, the second buffer layer 60 and the second protecting layer 70 are famed to make the total structure as a stable plate shape. In addition, as explained in FIG. 4, young's modulus of each of the materials forming the first buffer layer 40, the first protecting layer 50, the second buffer layer 60 and the second protecting layer 70 is smaller than young's modulus of each of the materials forming the first organic insulting film 20 and the second organic insulating film 30 and so forth, therefore, a extensibility of the flexible electronic device is not deteriorated.

Figure 8:
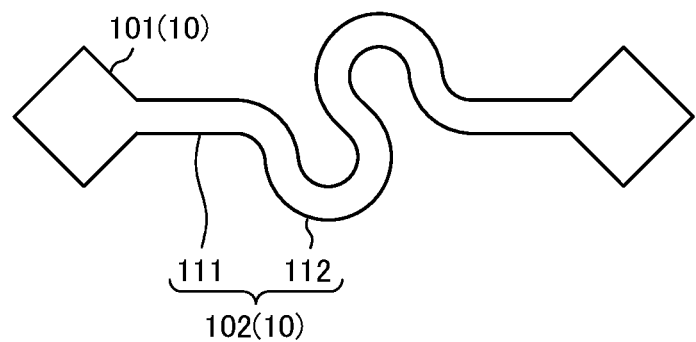
FIG. 8 is a plan view which shows a part of a base structure on which wirings and elements are famed.

FIG. 8 is a plan view of the base structure 10, formed from polyimide, which includes the scanning area 102 and the element area 101. The element area 101 on which element is disposed is an approximately diamond shape; the scanning line area 102, on which the scanning line 110 is disposed, is straight line 111 at the vicinity to the element area 101, however, most of the scanning line area 102 is in meander structure 112, which can stretch flexibly.

Figure 9:
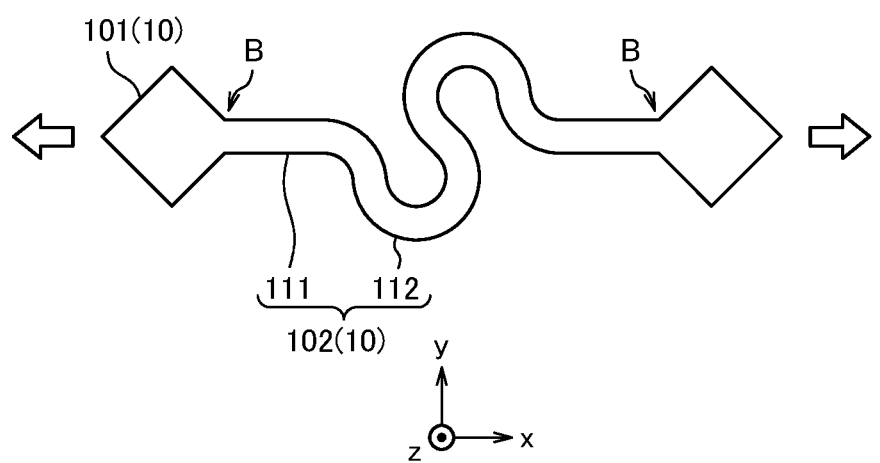
FIG. 9 is a plan view which shows a portion in which a large stress is built when the flexible electronic device is stretched in lateral direction (the x direction)

FIG. 9 is a plan view to show a problem when the structure of FIG. 8 is stretched in a direction indicated by white arrow. In this case, a stress is built at connection portion B between the element area 101, which is diamond shaped, and a straight portion 111 of the meander structure 102, on which the scanning line 110 is famed (herein after may be called as simply scanning line 110). In addition, the element area 101, which includes element 100, inorganic insulating film 80 and so forth, has higher rigidity than other portions. Therefore, a stress is further built at the connection portion B between the element area 101, which is diamond shaped, and the straight portion 111 of the scanning line area 102.

Figure 10:
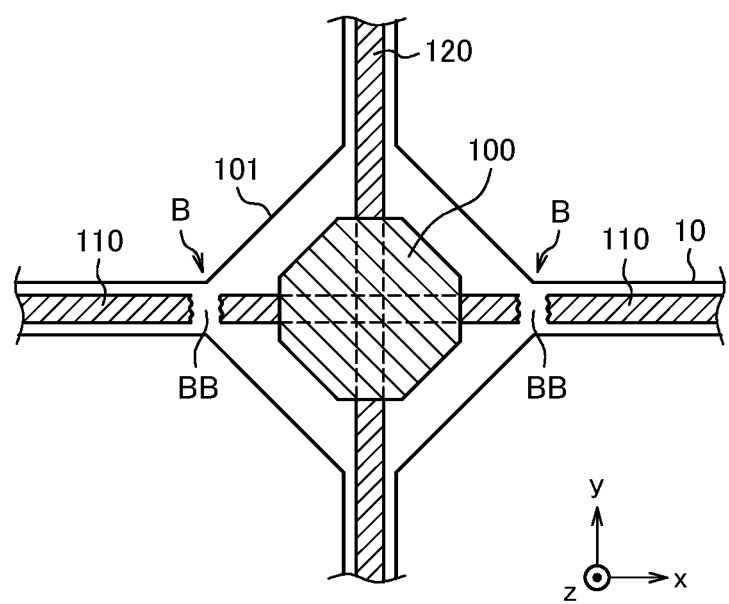
FIG. 10 is a plan view which shows a break occurring in a wiring at which a large stress is built as shown in FIG. 9.

Nevertheless, since the resin as polyimide, which constitutes the base structure 10 is strong, it is not broken easily; however, the scanning line 110, which is formed on the base structure 10 and is made of metal, is easily broken. This phenomenon is depicted in FIG. 10. FIG. 10 is a plan view which shows the scanning line 110 is broken at the portion BB in which a large stress is built when the flexible electronic device is stretched in lateral direction (the x direction). The present invention is to realize the structure which can prevent such breaking of the scanning line 110.

Figure 11:
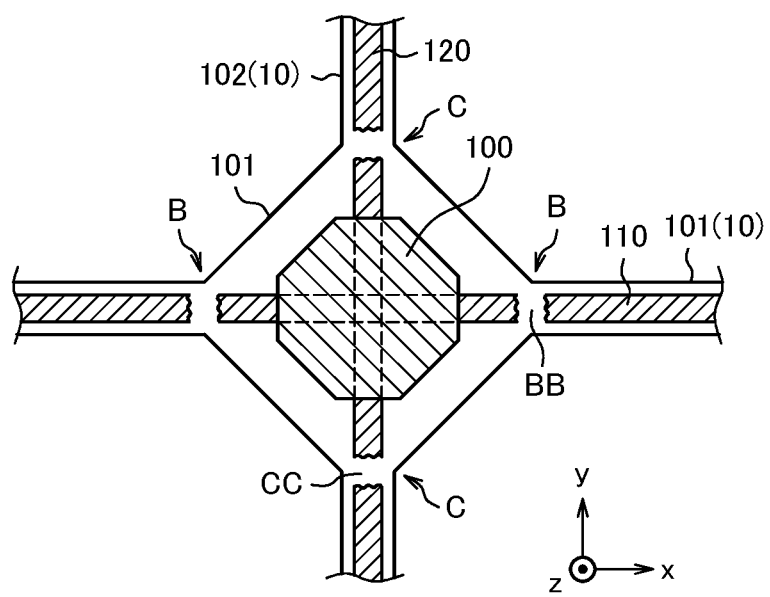
FIG. 11 is a plan view to show portions in which disconnections occur when the flexible electronic device is stretched in four directions in a plane.

In the meantime, FIG. 10 shows when the flexible electronic device is stretched in lateral direction (the x direction); however, when the flexible electronic device is stretched in longitudinal direction (the y direction), the same phenomenon occurs in the signal line 120. The present invention is also applicable to the problem in the signal lines 120. FIG. 11 is a plan view in which a disconnection BB occurs at the place where a large stress is built in the signal line 120 when the electronic device is stretched in longitudinal direction (the y direction).

Figure 12:
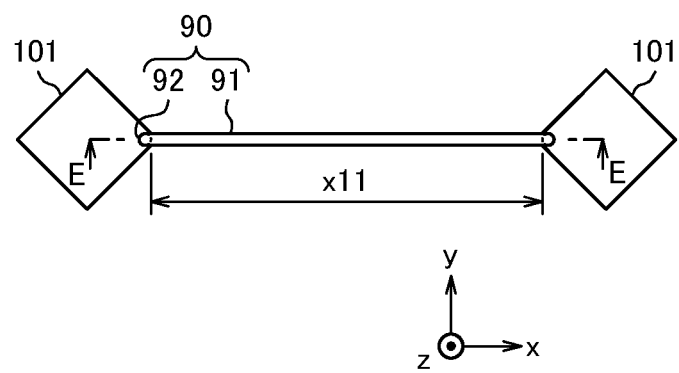
FIG. 12 is a plan view which shows a characteristic of embodiment 1.
Figure 13:
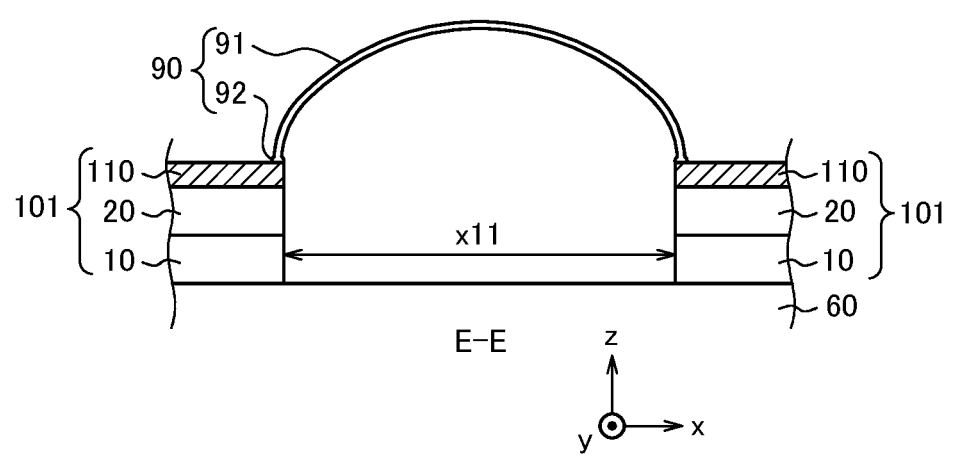
FIG. 13 is a plan view of FIG. 12 along the line E-E.

FIGS. 12 and 13 are respectively a plan view and a cross sectional view which show the schematic structure of embodiment 1 to counter measure the above explained problem. FIG. 12, which corresponds to FIG. 8 as a comparative example, is a plan view of the present invention. In FIG. 12, the meander structure 102 in FIG. 8 does not exist; the element areas 101 are connected with each other by wire bonding in FIG. 12.

In FIG. 12, the element area 101 is formed from the base structure 10, the first insulating film 20, and the scanning line 110. In FIG. 12, bonding pad and so forth are omitted. A distance between the two element areas 101 in the x direction is x11. The two element areas 101 are connected with each other by wire bonding 90. The wire bonding 90 is constituted from a bonding wire 91 and a connection portion 92. The connection portion 92 can be either ball bonding or wedge bonding; suitable process can be chosen. Herein after, the word of wire bonding 90 may include both a connection portion 92 and a bonding wire 91.

FIG. 13 is a cross sectional view of FIG. 12 along the line E-E. In FIG. 13, the wire bonding 90 is connected to the scanning line 110 with bending state in z direction. When the flexible electronic device is stretched in the x direction, a bending amount in the z direction of the wiring 91 is flexibly changed, thus, a building of stress at connection portion 92 of the wire bonding 90 can be avoided.

Figure 14:
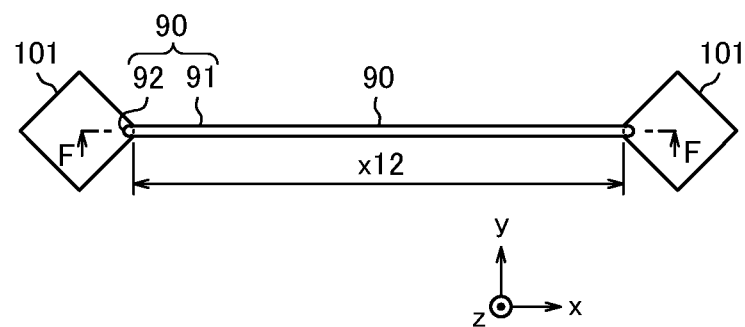
FIG. 14 is a cross sectional view in which the flexible electronic element is stretched in the x direction.
Figure 15:
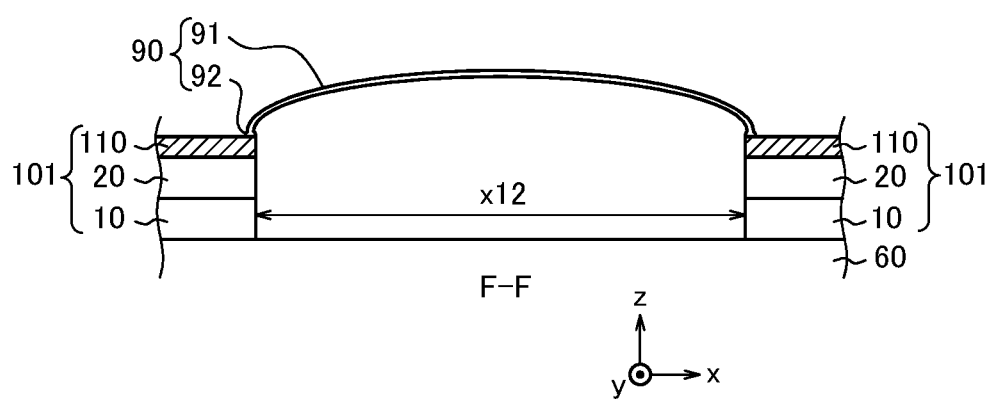
FIG. 15 is a cross sectional view of FIG. 14 along the line F-F.

FIG. 14 is a plan view in which the flexible electronic device is stretched in the x direction. A distance between the two element areas 101 is x12 as a result of stretching. The length x12 is, e.g., 1.5 times the distance x11. FIG. 15 is a cross sectional view of FIG. 14 along the line F-F. In FIG. 15, bending amount in the z direction of the bonding wire 91 is decreased, however, large stress is not built at the connection portion 92. A diameter of the bonding wire 91 is approximately 15 to 30 µm, thus, a building of stress is very little.

A stress famed by stretching in the x direction is mainly undertaken by the first buffer layer 40, the first protecting layer 50, the second buffer layer 60, and the second protecting film 70 shown in FIG. 4. Therefore, a stress which is built in the scanning wire 110 and the wire bonding 90 is little, thus, a disconnection can be avoided. In the meantime, the structures explained from FIG. 3 to FIG. 11 are the same in embodiment 1 except the connection structure between the elements 100 by the scanning lines 110 and the signal lines 120.

Figure 16:
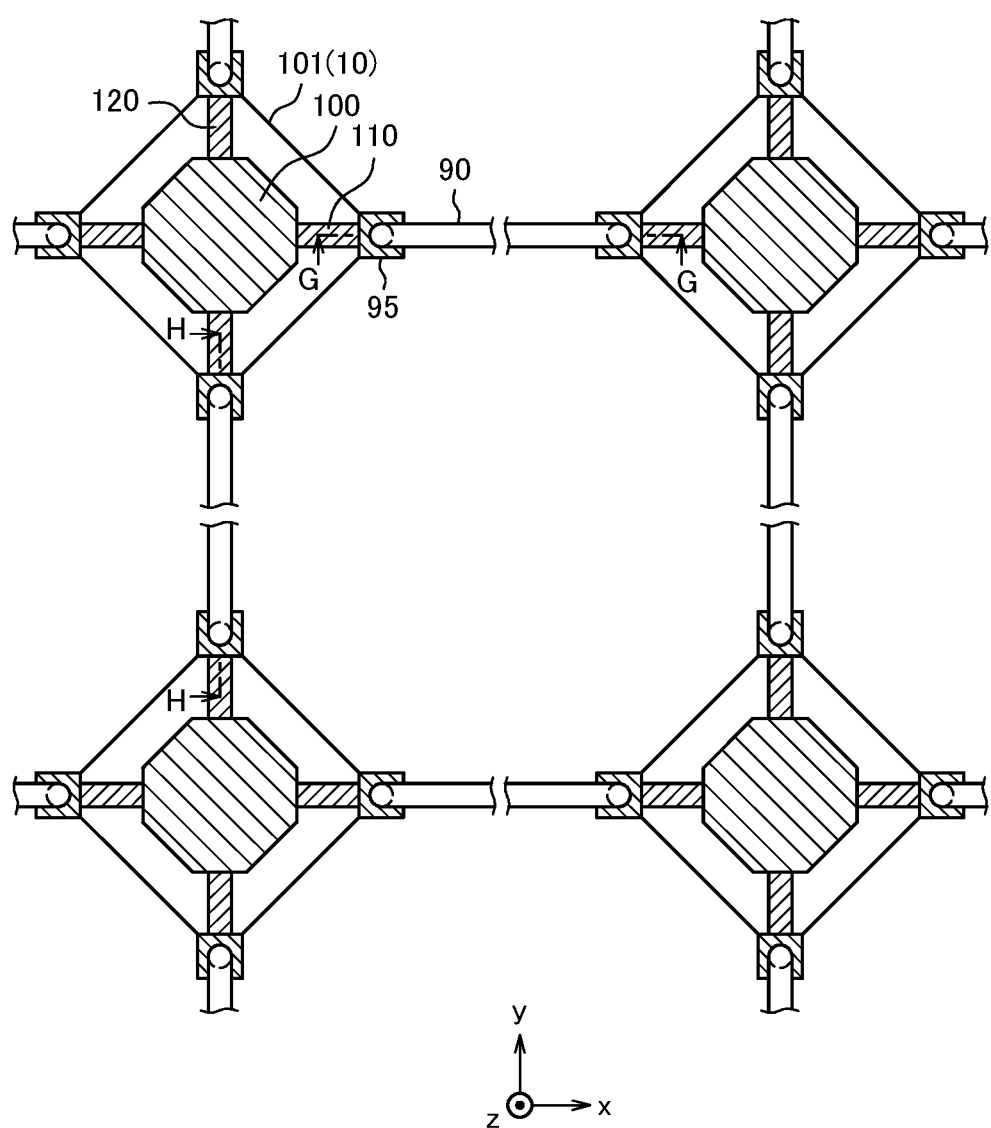
FIG. 16 is a plan view of embodiment 1.

FIG. 16 is a detailed plan view of embodiment 1. Although the elements 100 and the element area 101 are arranged in matrix, only 4 elements are shown in FIG. 16. In each of the element area 101, the scanning line 110, the signal line 120 and so forth are famed in addition to the element 100. The scanning lines 110 are connected to each other by the wire bonding 90; the signal lines 120 are connected to each other by the wire bonding 90.

Figure 17:
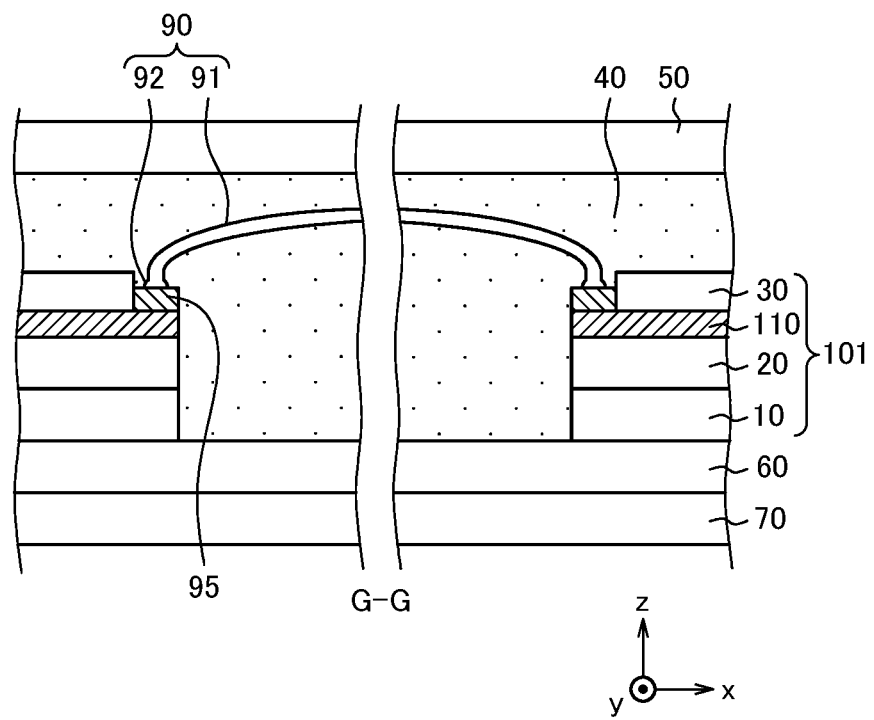
FIG. 17 is a cross sectional view of FIG. 16 along the line G-G.

FIG. 17 is a cross sectional view of FIG. 16 along the line G-G. In FIG. 17, the element area 101 is famed from the base structure 10, the first organic insulating film 20, the scanning line 110, and the second organic insulating film 30. The scanning lines 110 in the two element areas are connected to each other by wire bonding 90. The second organic insulating film 30 has a cut out at a terminal, and the scanning line 110 is exposed at this portion; a bonding pad 95, formed from aluminum, is formed on the exposed scanning line 110 in this cut out. The bonding wire 91 uses, e.g., aluminum. Alternatively, for example, cupper or gold may be used for the bonding wire 91 and the bonding pad 92.

In FIG. 17, the first buffer layer 40 is famed covering the wire bonding 90, the second organic insulating film 30 and so forth. The first buffer layer 40 is foiled from soft substance so that a bending amount of the wire bonding 90 can be changed flexibly; that is to say, they are more stretchable than polyimide which forms the base structure 10 and so forth; in other words, the material of first buffer layer 40 has smaller young's modulus than that of polyimide which forms the base structure 10 and so forth; or the material of first buffer layer 40 has lower hardness. For example, resin of acrylic, urethan, epoxy, silicon and so forth can be listed for that purpose.

Other structures of FIG. 17 are the same as the structure explained in the comparative example. That is to say, the first buffer layer 40 is covered by the first protecting layer 50; the second buffer layer 60 is famed under the element area 101 and the first buffer layer 40. The second protecting film 70 is famed under the second buffer layer 60.

Figure 18:
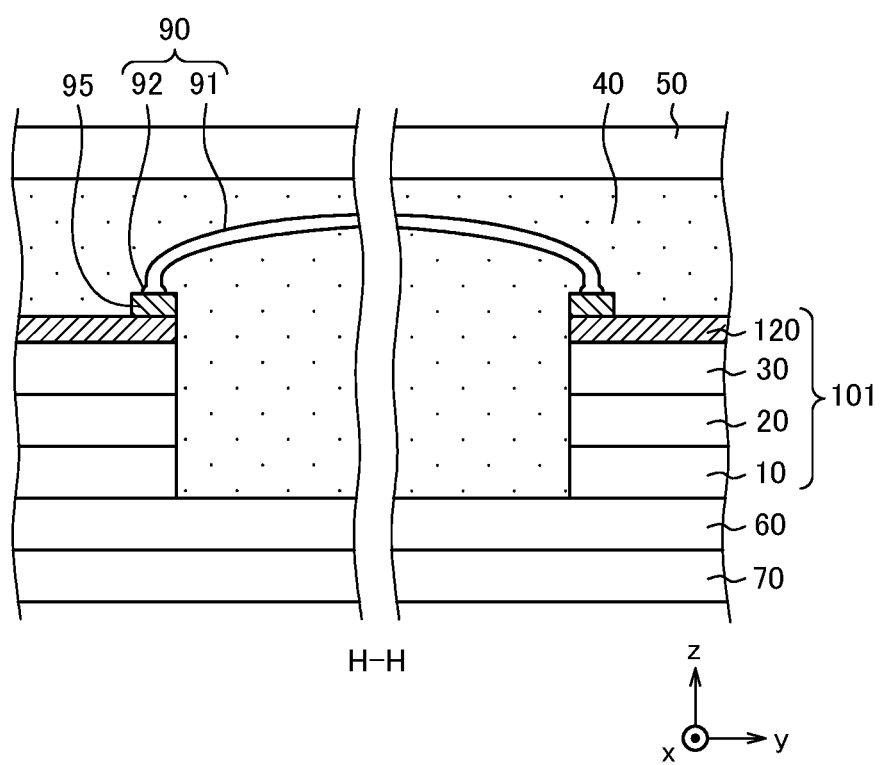
FIG. 18 is a cross sectional view of FIG. 16 along the line H-H.

FIG. 18 is a cross sectional view of FIG. 16 along the line H-H. In FIG. 18, the element area 101 is famed from the base structure 10, the first organic insulating film 20, the second organic insulating film 30 and the signal line 120. The signal lines 120 in the two element areas 101 are connected with each other by wire bonding 90. Since the signal line 120 is formed on the second organic insulating film 30, a cut out is not necessary in the second organic insulating film 30. A bonding pad 95 is famed at the terminal of the signal line 120 for wire bonding 90. Other structures in FIG. 18 are the same as those explained with reference to FIG. 17.

In the structure of FIG. 17 and FIG. 18, when the flexible electronic device is stretched in the x direction or the y direction, most stretching amount is under taken by the structure other than the element areas 101. Since the connections between the element areas 101 are flexibly connected by wire bonding 90, a stress built in the wirings is very little.

On the other hand, the element area 101 is small and is famed from polyimide, which has a large mechanical strength; therefore, a distortion in the element area 101 can be limited in very little amount even if the flexible electronic device is stretched in the x-y plane. In addition to the scanning line 110 and the signal line 120, the element as sensor and so forth, the inorganic insulating film and so forth are formed on the element area 101; however, since a distortion in the element area 101 can be made small, those elements are not broken. Therefore, a reliability in the stretchable electronic device can be improved.

In the manufacturing process, the flexible electronic device of FIGS. 16 through 18 can be formed as follows: the element areas 101, which are separated from each other and not electrically connected with each other, are famed on the glass substrate. Subsequently, the element areas 101 are connected to each other by the wire bonding 90.

In the meantime, in many cases, the elements 100 famed on the element areas 101 are simultaneously famed with the Thin Film Transistors (TFT) and so forth. In such a case, the first organic insulating film 20 and the second organic insulating film 30 and so forth are simultaneously famed with those elements. Therefore, a manufacturing process of the first organic insulating film 20 including the scanning line 110 on which wire bonding is connected, and a manufacturing process of the second organic insulating film 30 including the signal line 120 on which wire bonding is connected become different according to species of the sensors and the structure of the TFT, which control the element 100.

Figure 19:
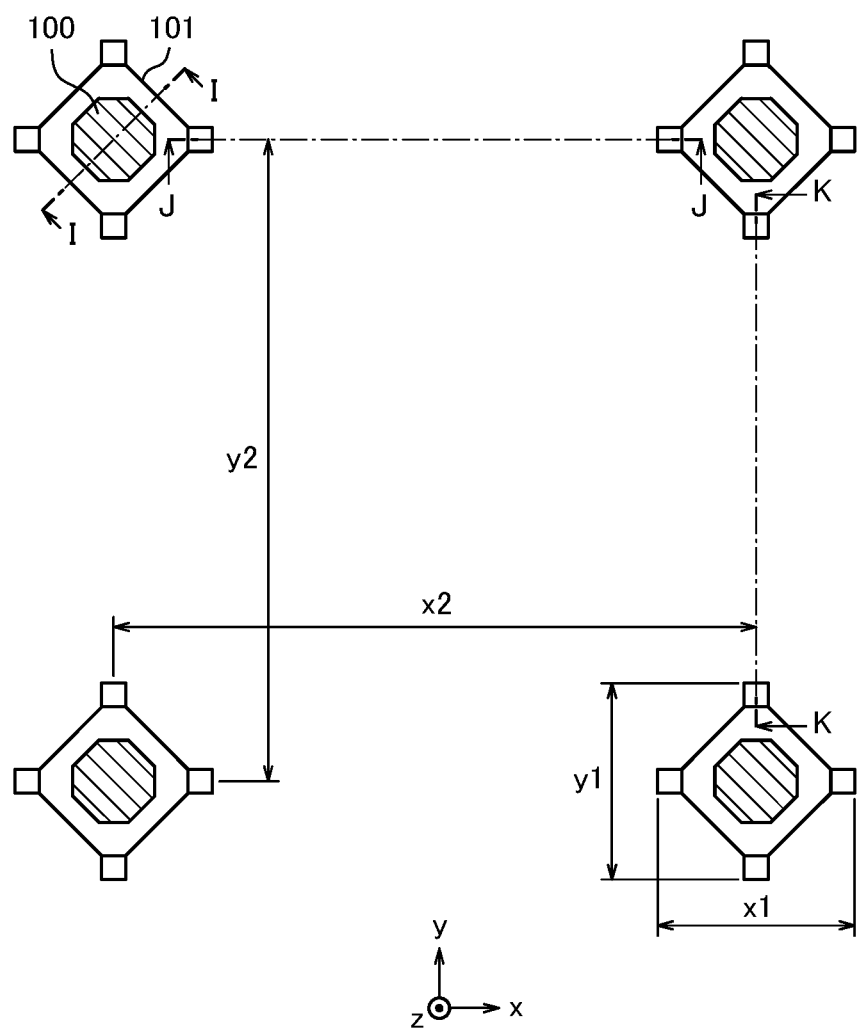
FIG. 19 is a plan view to show an arrangement of element areas in embodiment 1.

FIG. 19 is a plan view which shows placements of element areas 101 in embodiment 1. A size x1 of the element area 101 in the x direction is, e.g., 100 μm; a size y1 of the element area 101 in the y direction is, e.g., 100 μm. A distance x2 between the two element areas 101 in the x direction is e.g., 250 μm (center to center); a distance y2 between the two element areas 101 in the y direction is e.g., 250 μm (center to center). In general, x2 is twice or more of x1; y2 is twice or more of y1.

After the wire bonding process, the element areas 101 shown in FIG. 19 are covered by the first buffer layer 40 and the first protecting layer 50. After that, the glass substrate is removed; subsequently, the elements areas 101 are covered by the second buffer layer 60 and the second protecting layer 70. Since each of the element areas 101 is supported by the first buffer layer 40 and the first protecting layer 50, the element areas 101 do not come apart even the glass substrate is removed. The glass substrate can be removed by applying laser at interfaces between glass substrate and the element layers 101, and between the glass substrate and the buffer layer 40.

The above explained cross sectional structure of the flexible electronic device is an example to explain the present invention. The present invention can be applied to not only to the above explained flexible electronic device but also can be applied to other flexible electronic devices having different cross-sectional structures.

Further, the configuration of the scanning line driving circuit 115, the signal line driving circuit 125, the power source circuit 130, and so forth may be different from the structure in FIG. 1; accordingly, the layers in which the scanning lines 110 and the signal lines 120 may be different from the above explained structure. However, the present invention can be applied to those structures.

What is claimed is:

1. An electronic device comprising:
a plurality of element areas, famed from a first organic insulating film, and famed in island shape arranged in a first direction with a first space and arranged in a second direction with a second space,
wherein an element, a first wiring extending in the first direction and a second wiring extending in the second direction are famed in each of the plurality of element areas,
the first wirings famed in the plurality of the element areas are connected with each other by a first wire bonding in the first direction, and
the second wirings famed in the plurality of the element areas are connected with each other by a second wire bonding in the second direction.

2. The electronic device according to claim 1,
wherein the plurality of the element areas are famed on a second organic insulating film and covered by a third organic insulating film.

3. The electronic device according to claim 2,
wherein each of young's modulus of the second organic insulating film and the third organic insulating film is smaller than young's modulus of the first organic insulating film.

4. The electronic device according to claim 1,
wherein the first organic insulating film is formed from polyimide.

5. The electronic device according to claim 1,
wherein a distance, in center to center, in a first direction between adjacent element areas is twice or more of a size of each of the element areas in the first direction.

6. The electronic device according to claim 1,
wherein a distance, in center to center, in a second direction between adjacent element areas is twice or more of a size of each of the element areas in the second direction.

7. The electronic device according to claim 1,
wherein elongation at break in a major surface is 10% or more.

8. The electronic device according to claim 1,
wherein the electronic element includes a transistor or diode.

9. The electronic device according to claim 1,
wherein the electronic element includes either a photo sensor, a temperature sensor, a pressure sensor, a touch sensor, a light emitting element, or light receiving element.

10. The electronic device according to claim 1,
wherein the electronic element is an actuator.

11. The electronic device according to claim 2,
wherein the second organic insulating film is famed later than the third organic insulating film.

12. The electronic device according to claim 2,
wherein a fourth organic insulating film is formed on the third organic insulating film, and
fifth organic insulating film is formed under the second organic insulating film.

13. The electronic device according to claim 12,
wherein young's modulus of the fourth organic insulating film and the fifth organic insulating film are smaller than young's modulus of the first organic insulating film.

* * * * *